United States Patent [19]
Tsuiki

[11] Patent Number: 5,329,484
[45] Date of Patent: Jul. 12, 1994

[54] SEMICONDUCTOR MEMORY CIRCUIT, SEMICONDUCTOR MEMORY MODULE USING THE SAME, AND ACOUSTIC SIGNAL REPRODUCING SYSTEM

[75] Inventor: Hideo Tsuiki, Tokyo, Japan

[73] Assignee: NEC Corporation, Tokyo, Japan

[21] Appl. No.: 71,389

[22] Filed: Jun. 2, 1993

[30] Foreign Application Priority Data

Jun. 2, 1992 [JP] Japan .................. 4-141211

[51] Int. Cl.⁵ ............................................ G11C 27/00
[52] U.S. Cl. .................................... 365/45; 365/185; 365/189.01
[58] Field of Search ................. 365/45, 185, 94, 95, 365/189.01, 230.03, 233, 194, 104; 369/3, 34, 35, 69

[56] References Cited

U.S. PATENT DOCUMENTS 4,963,866 10/1990 Duncan ........................... 365/45
5,164,915 11/1992 Blyth ............................... 365/45

FOREIGN PATENT DOCUMENTS 58-85997 5/1983 Japan ............................... 365/45
3-119399 5/1991 Japan .

Primary Examiner—Eugene R. LaRoche
Assistant Examiner—Vu A. Le
Attorney, Agent, or Firm—Young & Thompson

[57] ABSTRACT

A sequential access type memory medium of a large memory capacity is composed of a number of semiconductor memory modules, each including a semiconductor memory device and necessary peripheral circuits accommodated in a square package. The same number of terminals are provided on each of four sides of the square package. The terminals on the four sides are so wired that the same kind of signal is transferred through positionally corresponding terminals of four sides of the square package, and the terminals on one side are of a plug type and the terminals on the remaining three sides are of a socket type which can be fitted and connected with the plug type terminal so as to interconnect corresponding signal lines. In addition, positionally corresponding socket type terminals of three sides of each memory module are interconnected so as to interconnect the terminals for the same signal. Thus, a plurality of memory modules are interconnected in an arbitrary order and in arbitrary location with using no printed circuit board and with a high expandability, so that in each semiconductor memory module, an address signal is generated on the basis of the synchronous signal supplied from an external, and the synchronous signal is supplied to the just succeeding semiconductor memory circuit after the data reading of the first mentioned semiconductor memory circuit has been completed.

12 Claims, 7 Drawing Sheets

16 SEMICONDUCTOR MEMORY MODULE

SEMICONDUCTOR MEMORY CIRCUIT, SEMICONDUCTOR MEMORY MODULE USING THE SAME, AND ACOUSTIC SIGNAL REPRODUCING SYSTEM

BACKGROUND OF THE INVENTION

1. Field of the Invention

The present invention relates to a semiconductor memory circuit, a semiconductor memory module using the same, and an acoustic signal reproducing system, and more specifically to a semiconductor memory circuit composed of a ROM (read only memory), a semiconductor memory module enabling a plurality of memory modules to coupled to each other, and an acoustic signal reproducing system for a Hi-Fi (high fidelity) acoustic signal of a compact disc type.

2. Description of Related Art

A conventional semiconductor memory circuit composed of semiconductor memory devices, in particular a semiconductor memory circuit composed of ROM devices, can be divided into one in which the memory is accessed at random, and another in which the memory is accessed sequentially. In the former type in which the memory is accessed at random, it is necessary to supply an address signal so as to select one word from a number of words stored in memory.

For example, in order to select one word from $2^{16}$ words (=65,536 words), an address signal of a 16-bit length is necessary. In addition, if the number of words is increased, the length of the address signal correspondingly becomes large. In ordinary cases, the address signal is supplied in a parallel format in order to speed up the access operation. As a result, the number of address signal lines is increased with the increase in the number of words, namely, with the increase in the memory capacity. Therefore, an addition electronic circuit becomes necessary with the increase in the memory capacity. This imposes restrictions at the time of increasing the memory capacity or of determining the memory capacity. Furthermore, since individual memory devices have only relatively small memory capacity, such individual memory devices have to be combined to each other. This gives a further restriction in wiring or locating the address signal lines.

In the type in which the memory is accessed sequentially, since it is not necessary to supply the address signal for the purpose of selecting the word, a large memory capacity can be easily realized by using a number of semiconductor memory devices. In addition, the restriction at the time of determining the memory capacity is small. The memory circuit in which the memory is accessed sequentially, is now widely used in household electric appliances. In the case that the semiconductor memory circuit including a number of ROM devices as semiconductor memory devices, is used as a storing medium for a Hi-Fi acoustic signal and the like, a voluminous memory capacity is needed.

On the other hand, a conventional semiconductor memory module has such a structure that a plurality of semiconductor memory modules cannot be connected directly to each other, and are connected through an additional circuit such as a printed circuit board.

In addition, an acoustic reproducing system using the conventional semiconductor memory circuit are used for example in an audio response system of household electric appliances. However, since the absolute memory capacity is small, it is difficult to reproduce a high quality signal such as a Hi-Fi acoustic signal.

As mentioned above, the conventional semiconductor memory circuit has required the wiring of the address signal lines, which is one restriction at the time of increasing or determining the memory capacity. In addition, it is difficult to constitute a sequential access memory medium in which the memory access is sequentially performed.

The above mentioned conventional semiconductor memory module composed of the semiconductor memory circuit has been disadvantageous in which since a plurality of semiconductor memory modules are interconnected in a fixed order or arrangement by use of the printed circuit board, the sequential access memory medium cannot be freely constituted. In other words, it is not possible to freely connect an arbitrary number of conventional semiconductor memory modules in an arbitrary order.

The above mentioned conventional acoustic signal reproducing system using the semiconductor memory circuit has various disadvantages since electric means and mechanical means exists in a mixed condition. For example, there is a limit in vibration proof, endurance and reliability, and miniaturization and lightening are impossible. Therefore, this conventional acoustic signal reproducing system is not suitable to reproduction of the Hi-Fi acoustic signal because of the limited memory capacity.

SUMMARY OF THE INVENTION

Accordingly, it is an object of the present invention to provide a semiconductor memory circuit which has overcome the above mentioned defect of the conventional one.

Another object of the present invention is to provide a semiconductor memory circuit capable of making the wiring of address signal lines unnecessary and capable of easily realizing a large memory capacity by using a number of semiconductor memory devices.

Still another object of the present invention is to provide a semiconductor memory circuit capable of constituting a sequential access type memory medium in which there is less restriction at the time of determining the memory capacity.

A further object of the present invention is to provide a semiconductor memory module composed of a semiconductor memory circuit and enabling an arbitrary number of memory modules to be interconnected to each other in an arbitrary order or arrangement by using no printed circuit board, so that a sequential access type of memory medium can be freely constituted.

A still further object of the present invention is to provide an acoustic signal reproducing system using the semiconductor memory circuit, which system includes no mechanical means and therefore is excellent in vibration proof, in endurance and in reliability and can achieve the miniaturization, the lightening and the consumed energy reduction.

The above and other object of the present invention are achieved in accordance with the present invention by a semiconductor memory circuit comprising a semiconductor memory device, a read-out controller generating on the basis of a synchronous signal supplied from an external an address signal to the semiconductor memory device for the purpose of reading out data from the semiconductor memory device, the read-out controller also generating a read end signal when the reading of the data from the read-out controller has been completed, a feed-out means receiving the data read out from the semiconductor memory device for outputting the received data, a first gate means receiving the data outputted from the feed-out means and data from an external for outputting a selected one of the received two data, a feed-out control means receiving the read end signal for generating a feed-out control signal, a second gate means corresponding to the feed-out control signal to control the read-out control means so as to stop the generation of the address signal supplied to the semiconductor memory device, and a third gate means responding to the feed-out control signal to start to supply the synchronous signal to an external.

According to another aspect of the present invention, there is provided a semiconductor memory module comprising:

a substantially square package accommodating therein a semiconductor memory circuit which includes a semiconductor memory device, a read-out controller generating on the basis of a synchronous signal supplied from an external an address signal to the semiconductor memory device for the purpose of reading out data from the semiconductor memory device, the read-out controller also generating a read end signal when the reading of the data from the read-out controller has been completed, a feed-out means receiving the data read out from the semiconductor memory device for outputting the received data, a first gate means receiving the data outputted from the feed-out means and data from an external for outputting a selected one of the received two data, a feed-out control means receiving the read end signal for generating a feed-out control signal, a second gate means responding to the feed-out control signal to control the read-out control means so as to stop the generation of the address signal applied to the semiconductor memory device, and a third gate means responding to the feed-out control signal to start to supply the synchronous signal to external;

a set of terminals formed on each of four sides of the square package, the terminals on the four sides being so configured that the same kind of signal is transferred through positionally corresponding terminals of four sides of the square package, the terminals on one side being of a plug type and the terminals on the remaining three sides being of a socket type which can be fitted and connected with the plug terminal so as to interconnect corresponding signal lines, positionally corresponding socket type terminals of the three sides being interconnected so as to interconnect the terminals for the same signal.

According to still another aspect of the present invention, there is provided an acoustic signal reproducing system including:

means for generating a synchronous signal;

means receiving data from an external for generating a digital code of a predetermined length;

means receiving the digital code for converting the received digital code into an analog signal;

a plurality of semiconductor memory modules connected to each other in a cascaded manner, each of the semiconductor memory modules comprising: a substantially square package accommodating therein a semiconductor memory circuit which includes a semiconductor memory device, a read-out controller generating on the basis of a synchronous signal supplied from an external an address signal to the semiconductor memory device for the purpose of reading out data from the semiconductor memory device, the read-out controller also generating a read end signal when the reading of the data from the read-out controller has been completed, a feed-out means receiving the data read out from the semiconductor memory device for outputting the received data, a first gate means receiving the data outputted from the feed-out means and data from an external for outputting a selected one of the received two data, a feed-out control means receiving the read end signal for generating a feed-out control signal, a second gate means responding to the feed-out control signal to control the read-out control means so as to stop the generation of the address signal supplied to the semiconductor memory device, and a third gate means responding to the feed-out control signal to start to supply the synchronous signal to an external;

a set of terminals formed on each of four sides of the square package, the terminals on the four sides being so configured that the same kind of signal is transferred through positionally corresponding terminals of four sides of the square package, the terminals on one side being of a plug type and the terminals on the remaining three sides being of a socket type which can be fitted and connected with the plug type terminal so as to interconnect corresponding signal lines, positionally corresponding socket type terminals of the three sides being interconnected so as to interconnect the terminals of the same signal. a first one of the cascaded semiconductor memory modules being connected to supply the data to the digital code generating means, a tail end one of the cascaded semiconductor memory modules being connected with a terminator.

The above and other objects, features and advantages of the present invention will be apparent from the following description of preferred embodiments of the invention with reference to the accompanying drawings.

DESCRIPTION OF THE PREFERRED EMBODIMENTS

Now, embodiments of the present invention will be described with reference with drawings. Embodiments disclosed here to which the present invention is applied are a semiconductor memory circuit for recording and reproducing a Hi-Fi acoustic signal of the compact disc type, a semiconductor memory module incorporating therein the semiconductor memory circuit, and an acoustic signal reproducing system using the semiconductor memory modules. In addition, the compact disc type is such that the acoustic signal is composed of two channels: left channel and right channel, and includes a recording data which is recorded in a compact disc and which includes a basic data composed of a train of pulses of 1.4112 Mbits/second obtained by digitizing the signal with a sampling frequency of 44.1 KHz and a quantization number of 16 bits ($2 \times 44.1$ KHz $\times 16$ bits = 1.4112 Mbits/second), the basic data being also added and modulated with a error correcting signal called "CIRC". In the following only the basic data will be considered for simplification of the description.

Figure 1:
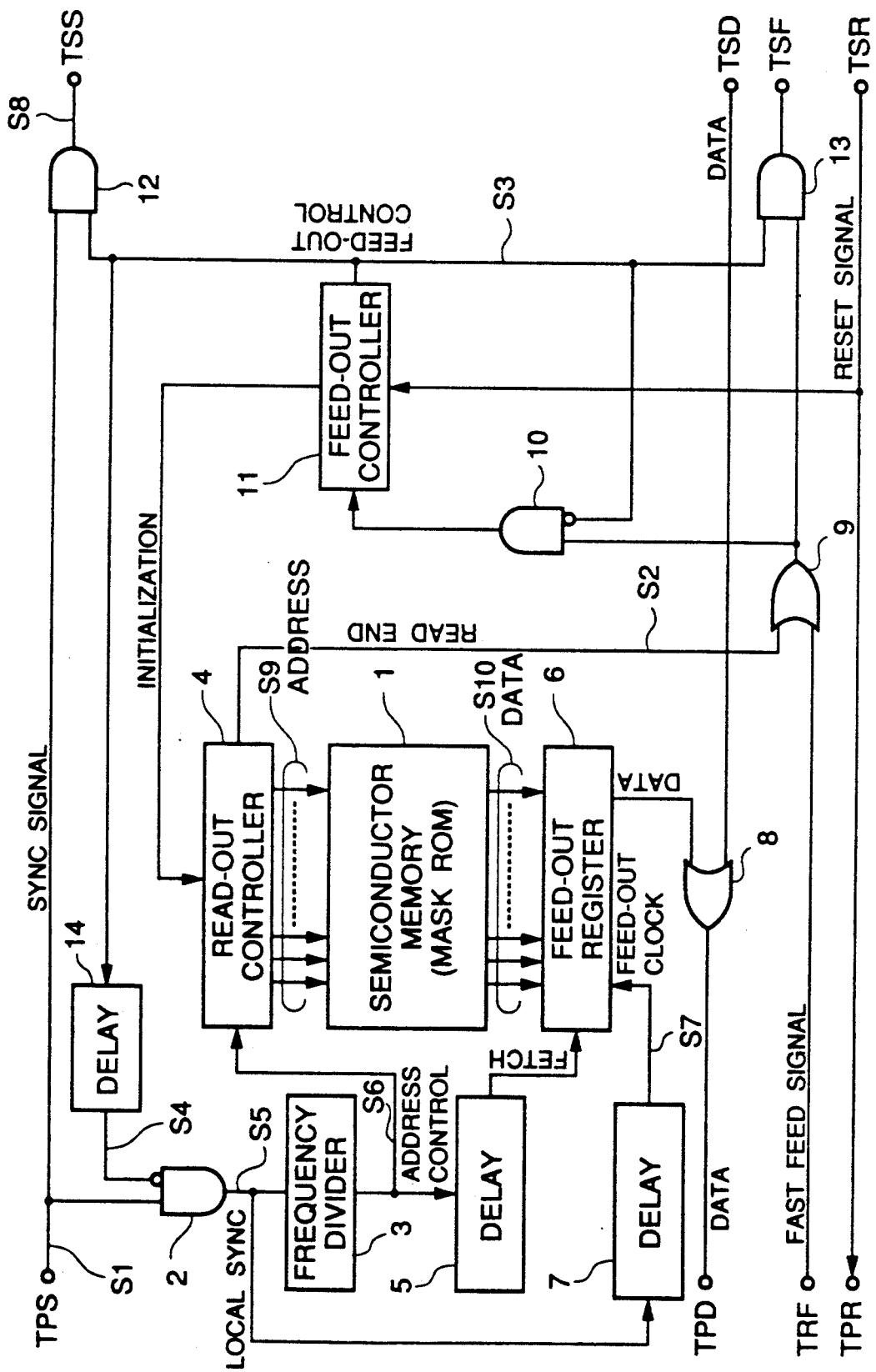
FIG. 1 is a block diagram of a first embodiment of the semiconductor memory circuit in accordance with the present invention.

Referring to FIG. 1, there is shown a block diagram of a first embodiment of the semiconductor memory circuit in accordance with the present invention.

The shown semiconductor memory circuit includes a semiconductor memory device 1 which is formed of for example a mask ROM. This semiconductor memory device 1 is associated with a read-out controller 4 which generates, on the basis of a synchronous signal S1 supplied from an external, an address signal S9 for reading data from the semiconductor memory device 1. This address signal S9 is supplied to the semiconductor memory device 1. The read-out controller 4 also generates a read-end signal S2 when the reading of the data from the semiconductor memory device 1 is completed. Data S10 read out from the semiconductor memory device 1 is supplied to a feed-out register 6 where the read-out data S10 is temporarily held and then fed out to an OR gate 8, which also receives data supplied through a data input terminal TSD from an external semiconductor memory circuit similar to the shown semiconductor memory circuit. An output of the OR gate 8 is connected to a data output terminal TPD.

The read-end signal S2 generated by the read-out controller 4 is supplied to another OR gate 9, which in turn has an output connected to an non-inverted input of an AND gate 10, an inverted input of which is connected to receive the feed-control signal S3 and an output of which is supplied to a feed-out controller 11 for generating a feed-out control signal S3. This feed-out control signal S3 is supplied to a delay circuit 14, which generates the delayed feed-out control signal S3 as a local synchronous control signal S4. This local synchronous control signal S4 is supplied to an inverted input of an AND gate 2, which in turn has its non-inverted input connected to a synchronous signal input terminal TPS so as to receive the synchronous signal S1. This AND gate 2 generates a local synchronous signal S5.

The local synchronous signal S5 is supplied to a frequency divider 3, which generates the frequency-divided local synchronous signal as an address control signal S6 which is supplied as a clock to the read-out controller 4. This address control signal S6 is also supplied to a delay circuit 5, which outputs the delayed address control signal to the feed-out register 6. In addition, the local synchronous signal S5 is supplied to a delay circuit 5, which generates the delayed local synchronous signal as a feed-out clock signal S7 to the feed-out register 6.

The shown semiconductor memory circuit also includes an AND gate 12 which has its one input connected to the synchronous signal input terminal TPS, and its other input connected to receive the feed-out control signal S3, and which generates a synchronous signal S8 through a synchronous signal output terminal TSS to an external semiconductor memory circuit similar to the shown semiconductor memory circuit. An output of the OR gate 9 and the feed-out control signal S3 are supplied to another AND gate 13, which generates a fast feed signal through an fast feed signal output terminal TSF to the external. In particular, the AND gate 2 is controlled by the feed-out control signal S3 so as to terminate the read-out and the feed-out of the data, and the AND gate 12 is controlled by the feed-out control signal S3 so as to initiate the output of the synchronous signal 8.

In the above mentioned semiconductor memory circuit, the semiconductor memory device 1 has the memory capacity of 64 Mbits (67,108,864: Dm) in the structure of 8 bits $\times$ 8,388,608 (Am) words. This memory capacity of the embodiment corresponds to Hi-Fi acoustic signal of about 45 seconds.

Now, operation of the semiconductor memory circuit will be described under the assumption that all the electronic circuits are initialized when the system is powered on.

When the synchronous signal S1 of 1.4112 Mbits/second is supplied through the synchronous signal input terminal TPS, since the feed-out controller 11 maintains its feed-out control signal S3 at a low level, the AND gate 2 generates the local synchronous signal S5, which is frequency-divided to one-eighth by the frequency divider 3. The address control signal S6 outputted from the frequency divider 3 is supplied to the read-out controller 4. In response to the address control signal S6, the read-out controller 4 sequentially generates the address signal S9 of 23 bits corresponding to one words of the above mentioned "Am" word, so that the read-out controller 4 selects one address within the semiconductor memory device 1. The 8-bit data S10 read out from the semiconductor memory device 1 is fetched into the feed-out register 6 in response to the signal obtained by delaying the address control signal S6 by the delay circuit 5.

Furthermore, the local synchronous signal S5 is delayed by the delay circuit 7 so as to be converted into the feed-out clocking signal S7 supplied to the feed-out register 6. Thus, the 8-bit data S10 fetched in the feed-out register 6 is serially outputted bit by bit through the OR gate 8 to the data output terminal TPD. Here, it is important that the OR gate 8 receives not only the data outputted from the feed-out register 6 but also the data which is supplied through the data input terminal TSD from a succeeding external semiconductor memory circuit.

The memory reading operation is performed as mentioned above, and when a (Dm)th pulse of the synchronous signal S1 is inputted from the synchronous signal input terminal TPS, the read-out controller 4 detects that the address reaches the address "Am" (maximum address) of the semiconductor memory device 1, and generates the read end signal S2. This read end signal S2 is supplied through the OR gate 9 and the AND gate 10 to the feed-out controller 11. Therefore, the feed-out controller 11 brings its feed-out control signal S3 to a high level of "1", so that the AND gates 12 and 13 are opened and the AND gate 10 is closed. Thus, the synchronous signal S8 is outputted through the synchronous signal output terminal TSS to the succeeding external semiconductor memory circuit. In addition, the feed-out control signal S3 of the high level is also supplied through the delay circuit 14 to the inverted-input of the AND gate 2 as the local synchronism control signal S4, so that the AND gate 2 inhibits passage of the (Dm+8)th and succeeding pulses of the synchronous signal S1. As a result the data reading and feeding-out are completed.

On the other hand, when the first feed signal is inputted to the fast feed signal input terminal TPF, the fast feed signal is passed through the OR gate 9, and the AND gate 13 and the fast feed signal output terminal TSF to the succeeding external semiconductor memory circuit. A reset signal supplied through a reset signal input terminal TSR from the succeeding external semiconductor memory circuit is passed to a reset signal output terminal TPR, and also supplied to the feed-out controller 11. In response to the reset signal, the feed-out controller 11 is initialized, and operates to also initialize the read-out controller 4. In addition, the fast feed signal output terminal TFT and the reset signal input terminal TSR are interconnected in the semiconductor memory circuit located at a tail end of a plurality of cascaded semiconductor memory circuits, and therefore, the fast feed signal which has reached the tail end semiconductor memory circuit is returned as the reset signal to the reset signal input terminal TSR.

In the above mentioned embodiment, the synchronous signal S1 supplied to the semiconductor memory circuit is frequency-divided in the inside of the semiconductor memory circuit. However, it would be apparent to persons skilled in the art that the semiconductor memory circuit may be modified to the construction in which a previously frequency-divided synchronous signal is inputted from the synchronous signal input terminal TPS, and on the other hand, there are provided data input terminals TSD and data output terminals TPD of the number equal to the inverted-number of the frequency division.

Figure 2:
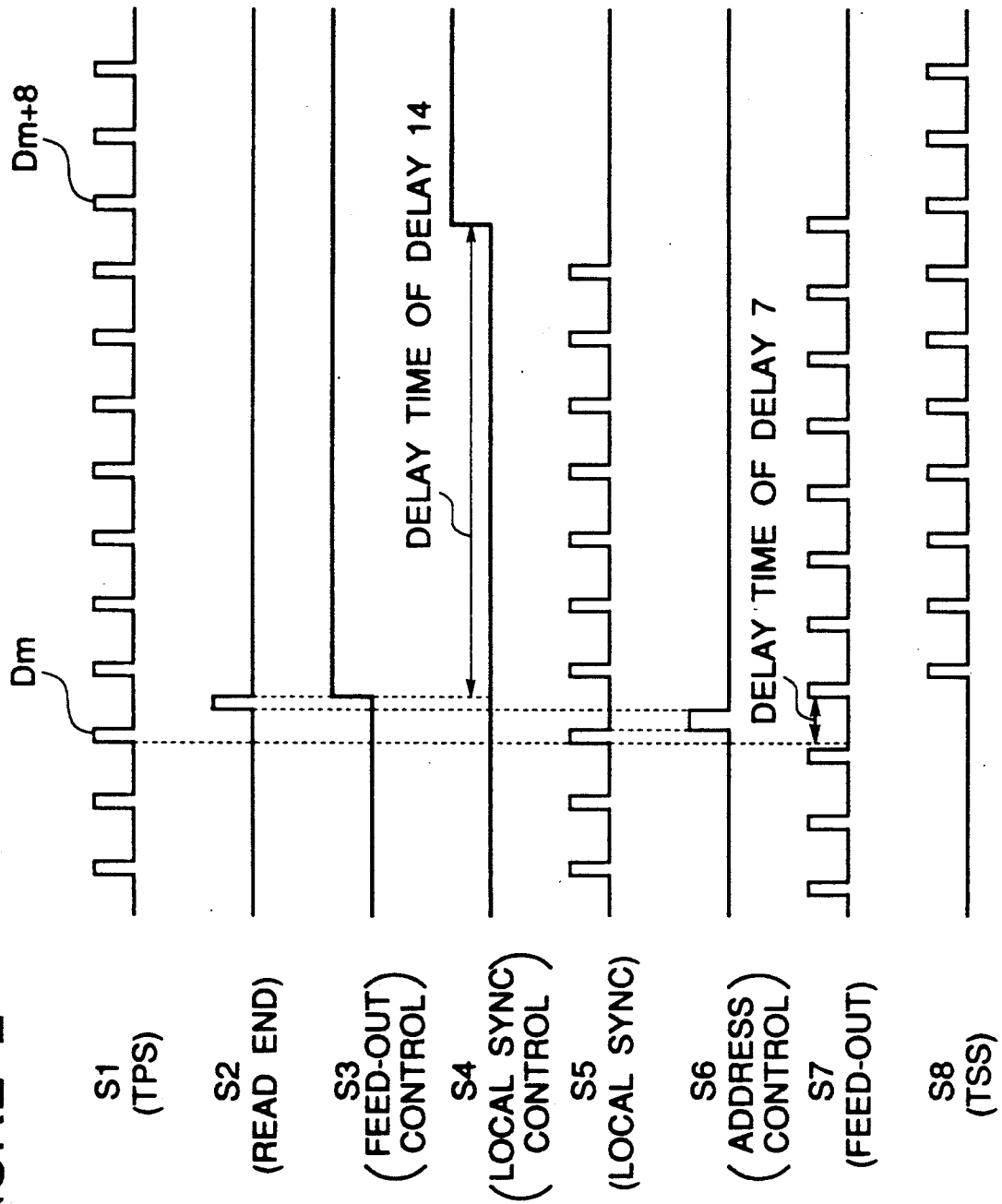
FIG. 2 is a timing chart illustrating various signals in the semiconductor memory circuit shown in FIG. 1.

Referring to FIG. 2, there is shown a timing chart showing the change of various signals S1 to S8 in the semiconductor memory circuit shown in FIG. 1, during a period of the (Dm)th pulse to the (Dm+1)th pulse of the synchronous signal S1, for the purpose of illustrating the above mentioned operation of the semiconductor memory circuit. As shown in FIG. 2, the delay circuit 14 gives a delay time sufficient to ensure that a required number of feed-out clocks S7 are supplied to the feed-out register 6 so as to sweep out the register 6 after the read end signal S2 is generated. The delay circuit 5 has a delay time sufficiently ensuring a time delay from the moment the address control signal S6 it supplied to the read-out controller 4 so as to cause the read-out controller 4 to generate the address signal S9 to the memory device 1, to the moment the data is read out from the memory device 1 in accordance with the address signal S9. In addition, also as shown in FIG. 2, the delay circuit 7 gives a delay time substantially corresponding a time delay after the moment the address control signal S6 it supplied to the read-out controller 4 until the data read out from the memory device 1 has been completed fetched in the feed-out register 6.

Figure 3:
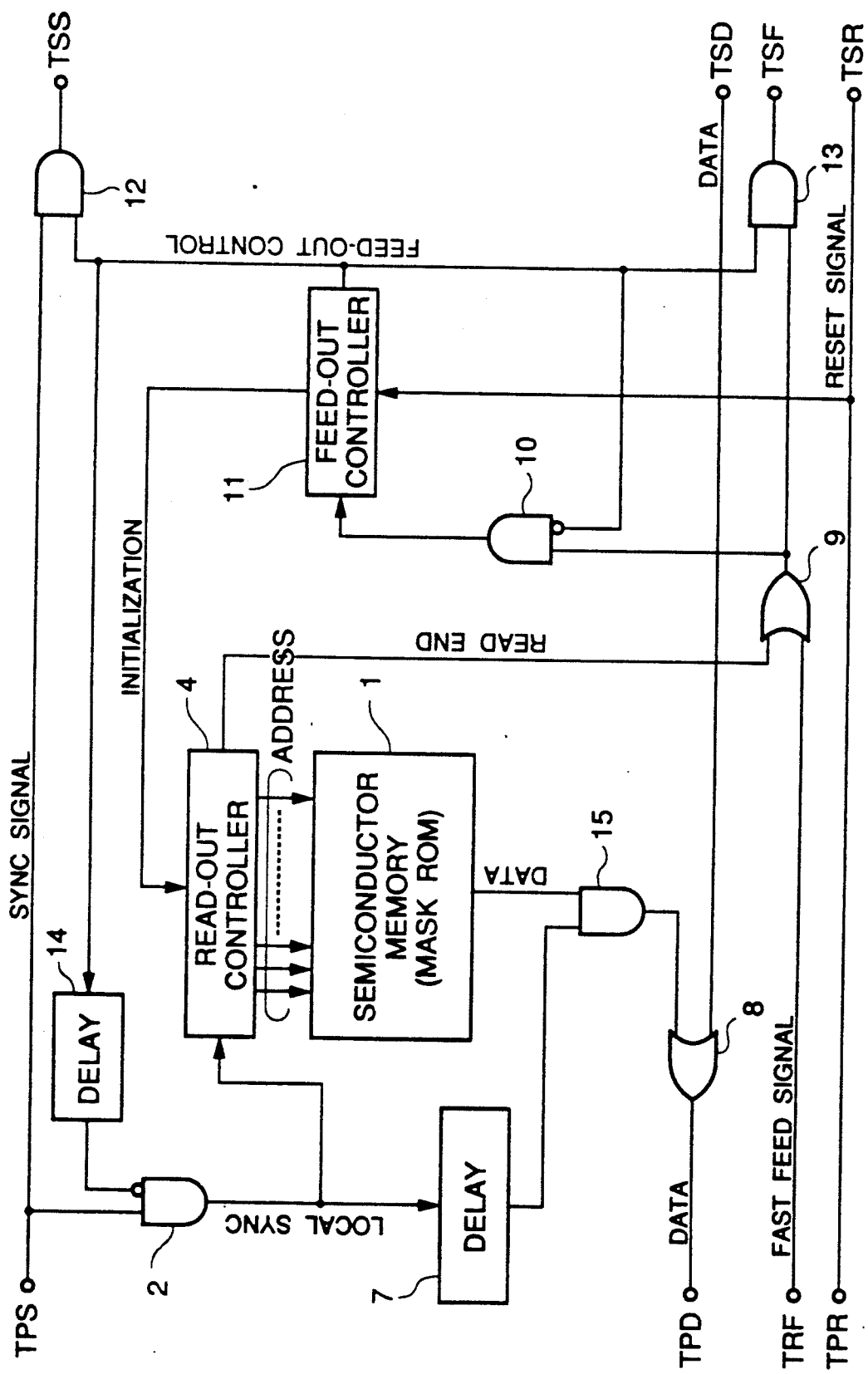
FIG. 3 is a block diagram of a second embodiment of the semiconductor memory circuit in accordance with the present invention.

Referring to FIG. 3, there is shown a block diagram of a second embodiment of the semiconductor memory circuit in accordance with the present invention. The second embodiment is a modification of the first embodiment in which the structure of 8 bits×8,388,608 words. Of the semiconductor memory device 1 is modified to the memory structure of 1 bit×67,108,864 words, namely, Dm=Am. With this arrangement, the memory circuit is simplified in comparison with the first embodiment. In FIG. 3, elements similar to those shown in FIG. 1 are given the same Reference Numerals.

The semiconductor memory circuit of the second embodiment includes a semiconductor memory device 1 and a read-out controller 4 which generates, on the basis of a synchronous signal supplied from an external, an address signal S9 to the semiconductor memory device 1 for reading data from the semiconductor memory device 1. The read-out controller 4 also generates a read-end signal when the reading of the data from the semiconductor memory device 1 is completed. Data read out from the semiconductor memory device 1 is supplied to an AND gate 15, and an output of the AND gate 15 and data supplied through a data input terminal TSD from an external similar semiconductor memory circuit are fed out to an OR gate 8, whose output is connected to a data output terminal TPD.

The read-end signal generated by the read-out controller 4 is supplied through another OR gate 9 and an AND gate 10 to a feed-out controller 11, which in turn generates a feed out control signal. This feed-out control signal is supplied to a delay circuit 14, which generates the delayed feed-out control signal as a local synchronous control signal. This local synchronous control signal and the synchronous signal from the synchronous signal input terminal TPS are supplied to an AND gate 2, which in turn generates a local synchronous signal as a clock to the read-out controller 4. This local synchronous signal is also supplied to a delay circuit 7, which outputs the delayed local synchronous signal to the AND gate 15.

The shown semiconductor memory circuit also includes an AND gate 12 which outputs the synchronous signal through a synchronous signal output terminal TSS to an external similar semiconductor memory circuit on the basis of the feed-out control signal from the feed-out controller 11. An AND gate 13 receives an output of the OR gate 9 and the feed-out control signal so as to generate a fast feed signal through an fast feed signal output terminal TSF to the external.

The other construction of the second embodiment is the same as the first embodiment. In addition, operation of the second embodiment would be apparent to persons skilled in the art from the construction of the second embodiment and the operation of the first embodiment mentioned hereinbefore. Therefore, operation of the second embodiment will be omitted.

In the second embodiment, with modification of the structure of of the semiconductor memory device 1 and addition of the AND gate 15, it is possible to omit the frequency divider 3, the delay circuit 5 and the feed-out register 6 which are required in the first embodiment.

Next, the semiconductor memory module in accordance with the present invention using the semiconductor memory circuit in accordance with the present invention will be described with reference to FIGS. 4A, 4B and 5.

Figure 4A:
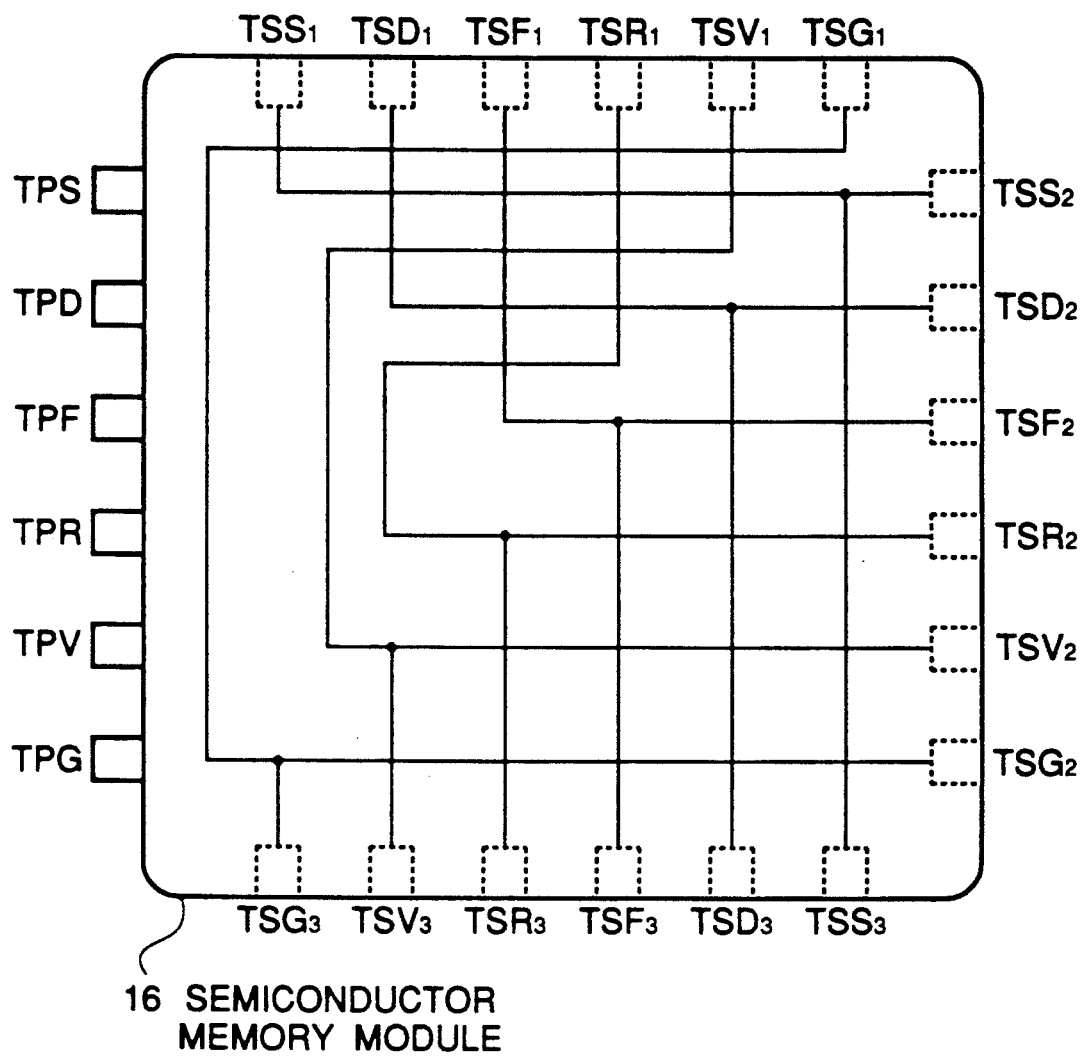
FIGS. 4A and 4B are a diagrammatic plan view and a diagrammatic side view of a first embodiment of the semiconductor memory module in accordance with the present invention using the semiconductor memory circuit in accordance with the present invention.
Figure 4B:
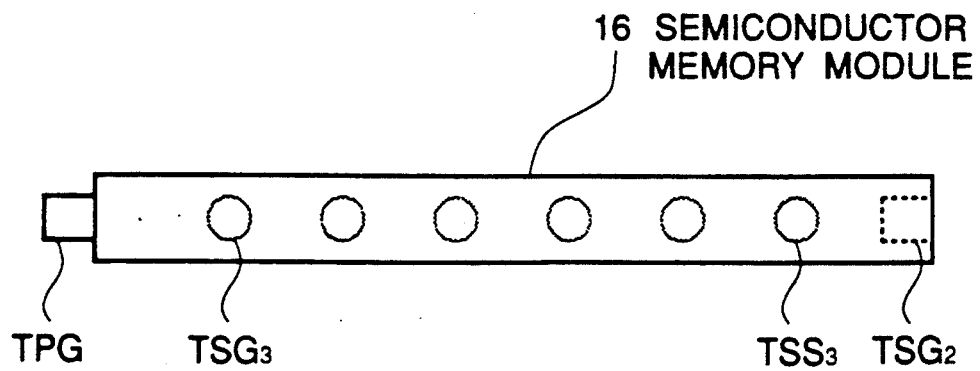

Referring to FIGS. 4A and 4B, there are shown a diagrammatic plan view and a diagrammatic side view of a first embodiment of the semiconductor memory module in accordance with the present invention using the semiconductor memory circuit in accordance with the present invention.

The shown semiconductor memory module includes a package 16 of a substantial square having four rounded corners of a curvature radius "R". This package 16 contains therein the semiconductor memory circuit (not shown in FIGS. 4A and 4B). Along each side of the package, there is provided a set of terminals. In shown embodiment, the terminals provided along one selected side of the package are of a plus type, which is indicated by Symbol "TP", and the terminals provided along each of the other three sides of the package are of a socket type, which is indicated by Symbol "TS". The plus type terminals "TP" and the socket type terminals "TS" are so sized as to be mutually fitted to each other.

These symbols "TP" and TS" are added with another symbol such as "S", "D", "F", "R", "V" and "G", indicating the kind of the signal or the voltage or current which is supplied through the terminal. "V" indicates a voltage supply voltage, and "G" shows a ground level. "S", "D", "F" and "R" would be apparent from the aforementioned description with reference to FIG. 1.

The "TP" terminals and the "TS" terminals are located in such a manner that when at least two semiconductor memory modules are coupled to each other through these terminals, the "TP" terminal and the "TS" terminal for the same kind of signal are fitted with each other.

In addition, the plus type terminals "TPS", "TPD", "TPF" and "TPR" of the module are connected to the terminals "TPS", "TPD", "TPF" and "TPR" of the semiconductor memory circuit shown in FIGS. 1 and 3, respectively. The plus type terminals "TPV", and "TPG" are connected to a voltage supply voltage terminal and a ground terminal (not shown) of the semiconductor memory circuit shown in FIGS. 1 and 3, respectively, and also connected to the socket type terminals "TSV", and "TSG". In addition, the socket type terminals "TSS", "TSD", "TSF" and "TSR" of the module are connected to the terminals "TSS", "TSD", "TSF" and "TSR" of the semiconductor memory circuit shown in FIGS. 1 and 3, respectively. Furthermore, the socket type terminals "TSS", "TSD", "TSF", "TSR", "TSV", and "TSG" provided on each of the three sides of the module are connected within the module to the corresponding socket type terminals provided on each of the other two sides, respectively. For example, the terminals "TSS1", "TSS2" and "TSS3" are interconnected as shown in FIG. 4A.

The module shown in FIG. 4A has four rounded corners, but the shape of the corners is not limited to this rounded corner. For example, the four corners may be of a flat cut shape.

Figure 5:
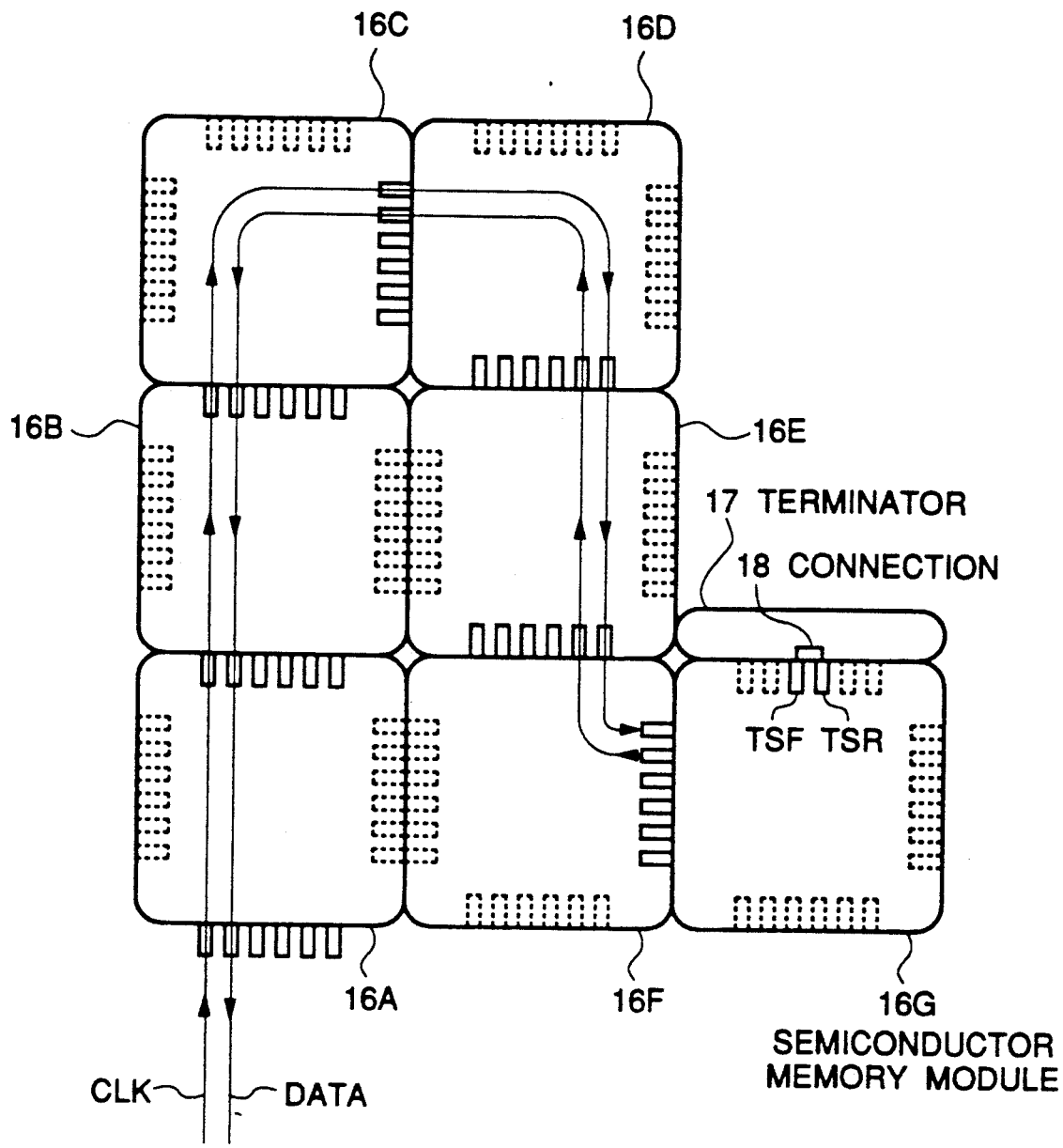
FIG. 5 is a plan view illustrating a plurality of semiconductor memory modules which are the same as that shown in FIGS. 4A and 4B and which are interconnected to each other.

FIG. 5 is a plan view illustrating that a plurality of semiconductor memory modules which are the same as that shown in FIGS. 4A and 4B are interconnected to each other.

In the example shown in FIG. 5, seven semiconductor memory modules 16A to 16G are cascaded by fitting the plus type terminals of one of each pair of adjacent semiconductor memory modules to the socket type terminals of the other of the pair of adjacent semiconductor memory modules, and by connecting a terminator 17 to the socket type terminals of a tail end semiconductor memory module 16B. In the terminator 17, the terminals "TSF" and "TSR" of the tail end semiconductor memory module 16G are interconnected by a connection 18 so as to form a termination, as mentioned hereinbefore. On the other hand, the plus type terminals of a first semiconductor memory module 16A are connected to a reproducer module of an acoustic signal reproducing system which will be explained hereinafter.

In the example shown in FIG. 5, the synchronous signal is transferred in the order of the semiconductor memory modules 16A, 16B, 16C, 16D, 16E, 16F and 16G, as shown by an arrow designated by Reference Symbol "CLK", and the read-out data is transferred in a direction as shown by an arrow designated by Reference Symbol "DATA".

Now, the acoustic signal reproducing system using the semiconductor memory circuit in accordance with the present invention will be described with reference to FIGS. 6 and 7.

Figure 6:
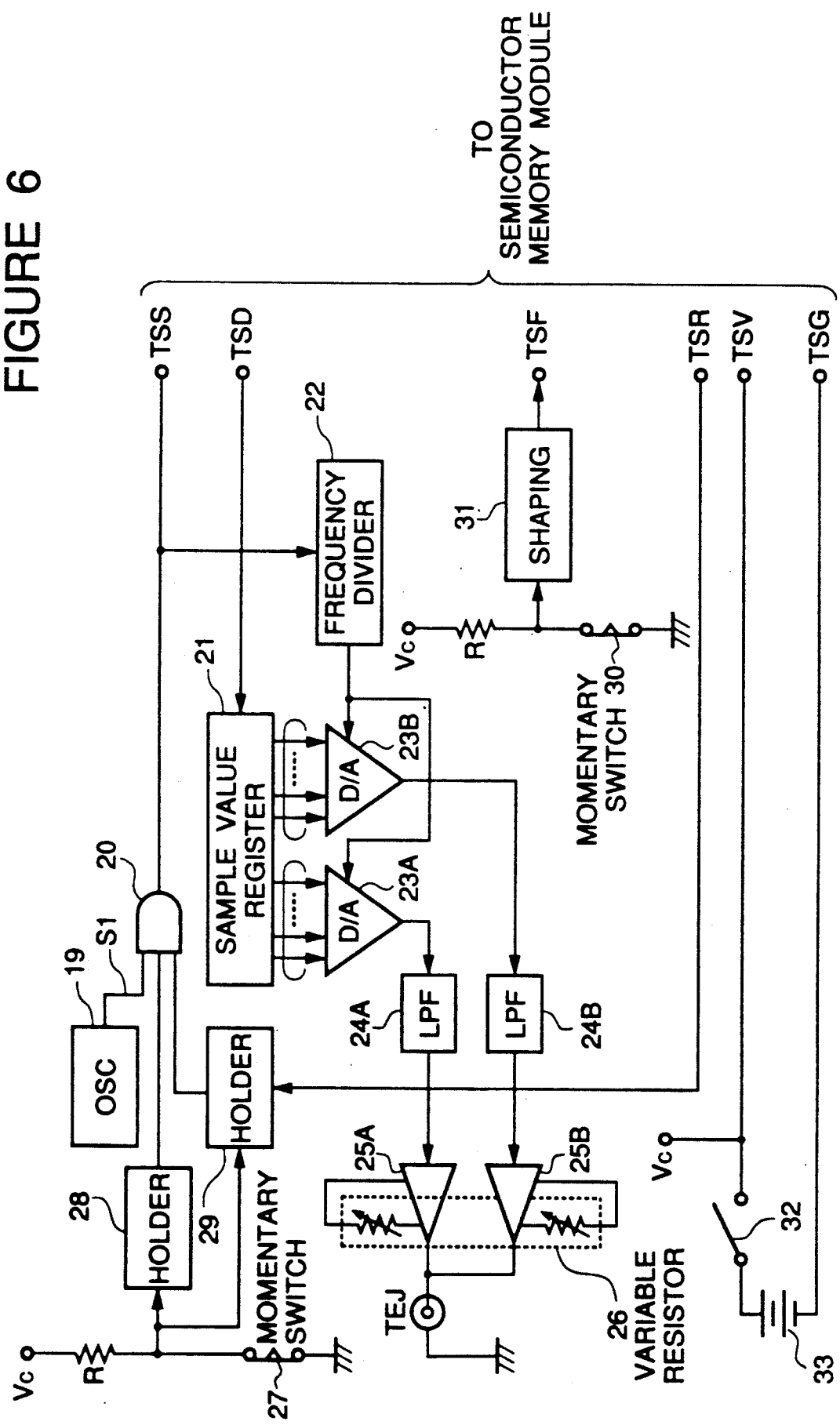
FIG. 6 is a circuit diagram of a reproducer section of the acoustic signal reproducing system using the semiconductor memory circuit in accordance with the present invention.

Referring to FIG. 6, there is shown a circuit diagram of a reproducer section of the acoustic signal reproducing system using the semiconductor memory circuit in accordance with the present invention.

The shown reproducer section of the acoustic signal reproducing system includes an oscillator 19 for generating the synchronous signal S1, and a pair of hold circuits 28 and 29 controlled by a momentary switch 27, which has its one end connected to the ground and its other end connected through a fixed resistor R to a high level voltage Vc. For example, the hold circuit 28 is composed of a J-K flipflop and the hold circuit 29 is formed of a R-S flipflop. An output of the oscillator 19 and the hold circuits 28 and 29 are connected to an AND gate 20, which in turn outputs the synchronous signal S1 to terminal TSS when the gate is opened by the hold circuit 28 and 29. The shown reproducer section also includes a sample value register 21 of for example 32 bits, which receives the data supplied through the terminal TSD and which generates a pair of digital codes of a predetermined length on the basis of the received data. The pair of digital codes are supplied to a pair of D/A (digital-to-analog) converters 23A and 23B, respectively, where the pair of digital codes are converted into a pair of analog signals. These D/A converters 23A and 23B are controlled by a frequency-divided synchronous signal outputted from a frequency divider 22 which receives the synchronous signal S1 from the AND gate 20.

The pair of analog signals outputted from the pair of D/A converters 23A and 23B are supplied through a pair of low pass filters 24A and 24B and a pair of amplifiers 25A and 25B to an earphone terminal TEJ, respectively. Each of these amplifiers 25A and 25B is associated with a variable resistor 26 for the purpose of the gain control.

Furthermore, there are provided another momentary switch 30 having its one end connected to the ground and its other end connected through a fixed resistor R to the high level voltage Ve. A connection node between the resistor R and the momentary switch 30 is connected to a waveform shaping circuit 31, which generates a fast feet signal to a terminal TSF. An voltage supply 33 is connected through an alternate switch 32 between a terminal TSV and a terminal TSG. The above mentioned reproducer section module is connected through the terminals TSS, TSD, TSF, TSR, TSV and TSG to the semiconductor memory module as mentioned hereinbefore.

In the above mentioned reproducer section module, the synchronous signal S1 generated in the oscillator 19 is outputted through the AND gate 20 and also through the terminal TSS to the semiconductor memory modules as shown in FIGS. 4A, 4B and 5. On other hand, the pulse train data supplied through the terminal TSD is inputted and held in the sample value register 21 of the 32 bits. This data of 32 bits corresponds to one sample value of the two channels (left channel + right channel). On the other hand the synchronous signal outputted from the AND gate 20 is frequency-divided to 1/32 by the frequency divider 22, and given with a slight delay in the frequency divider 22. The divided-by-32 and delayed signal is supplied to the D/A converters 23A and 23B. Here, "A" and "B" of reference Numerals 23A, 23B, 24A, 24B, 25A and 25B show the left channel and the right channel, respectively.

The 32-bit data in the sample value register 21 is converted by the D/A converters 23A and 23B into a pair of analog signals in units of 16 bits corresponding to the left channel and the right channel. The pair of analog signals are individually filtered by the low pass filters 24A and 24, respectively, and also individually amplified by the amplifiers 25A and 25B, respectively, so that the analog signals are supplied to the earphone terminal TEJ. The output level of the signals to supplied to the earphone terminal TEJ can be adjusted by the variable resistors 26.

The momentary switch 27 is provided for a start and stop control. When the switch 27 is operated, the hold circuit 28 of the J-K flipflop is inverted in its condition, and the hold circuit 29 of the R-S flipflop is brought into a condition of "1". On the other hand, this hold circuit 29 is reset into a condition of "0" in response to the reset signal supplied through the terminal TSR, so that the AND gate 20 is closed. The momentary switch 30 is provided for the fast operation, and when the momentary switch 30 is operated, the fast feed signal is outputted from the waveform shaping circuit 31 through the terminal TSF. The on/off operation of the voltage supply 33 is controlled by the alternate switch 32.

Figure 7:
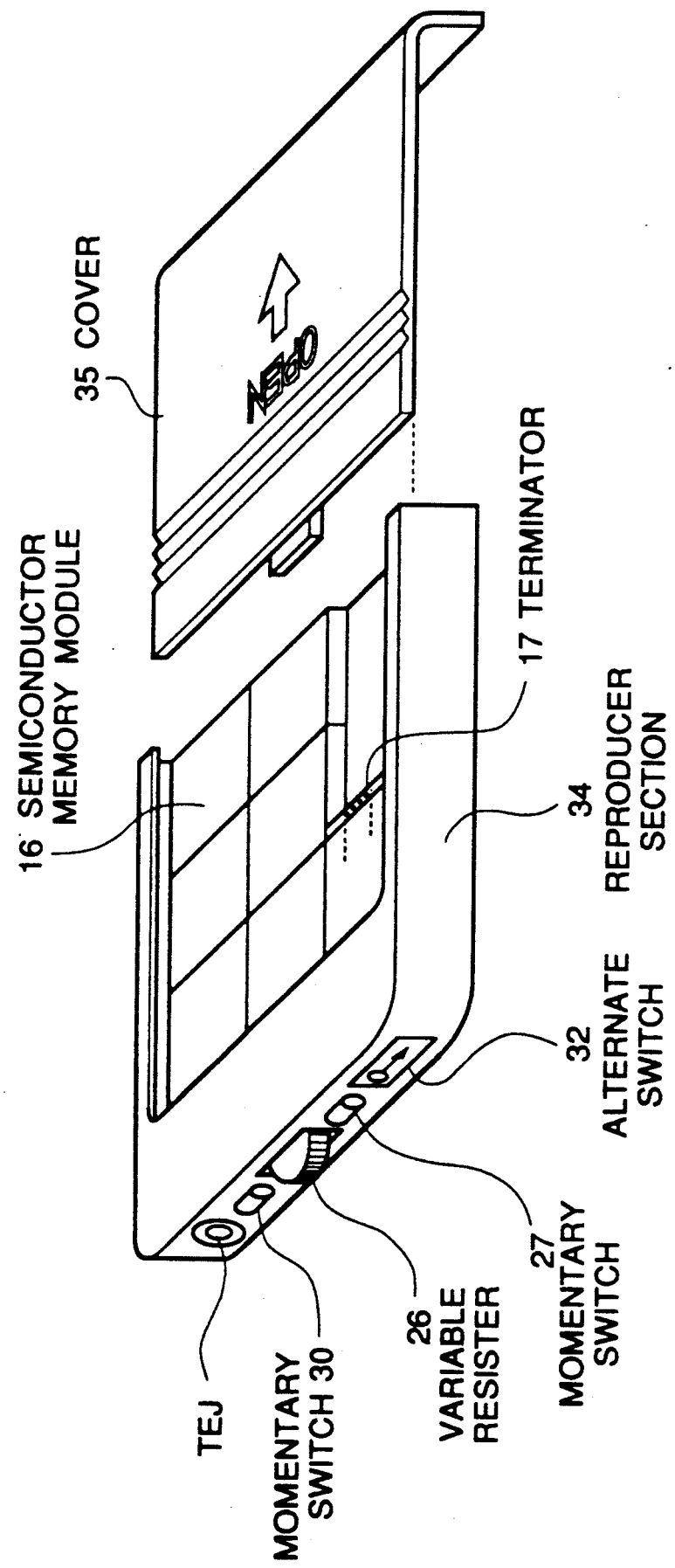
FIG. 7 is a diagrammatic perspective view of the acoustic signal reproducing system incorporating therein the reproducer section shown in FIG. 6.

FIG. 7 shows, in a diagrammatic perspective view, the acoustic signal reproducing system incorporating therein the reproducer section shown in FIG. 6. As shown in FIG. 7, the system includes a reproducer section casing 34 configured to accommodate therein the seven semiconductor memory modules 16 coupled as shown in FIG. 5 and connected with the terminator 17. The casing 34 is lidded with a slide type cover 35. It is a matter of course that the reproducer section casing 34 contains therein the reproducer section circuit shown in FIG. 6. The variable resistor 26, the momentary switches 27 and 30, the alternate switch 32 and the earphone terminal TEJ of the reproducer section circuit shown in FIG. 6 are provided on a front side of the casing 34, as shown in FIG. 7.

As mentioned above, the semiconductor memory circuit in accordance with the present invention is so constructed that an address signal is generated on the basis of the synchronous signal supplied from an external, and the synchronous signal is supplied to the just succeeding semiconductor memory circuit after the data reading of the first mentioned semiconductor memory circuit has been completed. With this arrangement, the address signal line wiring becomes unnecessary, and a large capacity memory composed of a number of semiconductor memory devices can be easily realized. In addition, it is possible to construct a sequential access type memory medium in which there is less restriction at the time of determining the memory capacity.

In addition, the semiconductor memory module using the semiconductor memory circuit in accordance with the present invention is characterized in that a set of terminals are provided on each side of a substantially square module package containing therein the semiconductor memory circuit in such a manner that the same kind of signal is transferred through positionally corresponding terminals of four sides of the square package, and the terminals on one selected side are of the plug structure and the terminals on the other three sides are of the socket structure, so that the plug structure terminals of one semiconductor memory module can be fitted and connected into the socket structure terminals of another semiconductor memory module so as to interconnect corresponding signal lines. In addition, positionally corresponding socket structure terminals of three of each semiconductor memory module are interconnected so as to interconnect the terminals for the same signal. Thus, a plurality of semiconductor memory modules are interconnected in an arbitrary order and in arbitrary location with using no printed circuit board. Accordingly, it is possible to freely construct a sequential access type memory medium composed of a plurality of semiconductor memory devices and having a high expandability.

Furthermore, the acoustic signal reproducing system using the semiconductor memory circuit in accordance with the present invention is characterized in that the memory medium is realized by directly connecting in a cascaded manner a plurality of semiconductor memory modules each containing therein the semiconductor memory circuit. Therefore, since no mechanical means is required, vibration proof, endurance and reliability are improved, and miniaturization, lightening and consumed energy reduction become possible. Furthermore, the acoustic signal reproducing system in accordance with the present invention makes it possible to freely arrange a music medium in accordance with a user's preference.

The invention has thus been shown and described with reference to the specific embodiments. However, it should be noted that the present invention is in no way limited to the details of the illustrated structures but changes and modifications may be made within the scope of the appended claims.

I claim:

1. A semiconductor memory circuit comprising a semiconductor memory device, a read-out controller generating on the basis of a synchronous signal supplied from an external an address signal to said semiconductor memory device for the purpose of reading out data from said semiconductor memory device, said read-out controller also generating a read end signal when the reading of the data from said read-out controller has been complete a feed-out means receiving the data read out from said semiconductor memory device for outputting the received data, a first gate means receiving the data outputted from said feed-out means and data from an external for outputting a selected one of the received two data, a feed-out control means receiving said read end signal for generating a feed-out control signal, a second gate means responding to said feed-out control signal to control said read-out control means so as to stop the generation of said address signal supplied to said semiconductor memory device, and a third gate means responding to said feed-out control signal to start to supply said synchronous signal to an external.

2. A semiconductor memory circuit claimed in claim 1 wherein said second gate means is formed of a first AND gate having a non-inverted input connected to a synchronous signal input terminal so as to receive said synchronous signal from the external and an inverted input connected to receive said feed-out control signal through a first delay circuit.

3. A semiconductor memory circuit claimed in claim 2 wherein said third gate means is formed of a second AND gate having its one input connected to said synchronous signal input terminal and its other input connected to receive said feed-out control signal, an output of said second AND gate being connected to a synchronous signal output terminal.

4. A semiconductor memory circuit claimed in claim 3 wherein said first gate means is formed of a first OR gate having its one input connected to receive the data outputted from said feed-out means and its other input connected to a data input terminal for receiving data from the external, an output of said first OR gate being connected to a data output terminal for outputting a selected one of the received two data to an external.

5. A semiconductor memory circuit claimed in claim 4 further including a second OR gate having its one input connected to a fast feed signal input terminal and its second input connected to receive said read end signal, and a third AND gate having its one input connected to an output of said second OR gate and its other input connected to receive said feed-out control signal, and output of said third AND gate being connected to a fast feed signal output terminal.

6. A semiconductor memory circuit claimed in claim 5 wherein said feed-out control means receives said output of said second OR gate through a fourth AND gate which has its non-inverted input connected to said output of said second OR gate and its inverted input connected to receive said feed-out control signal, an output of said fourth AND gate being inputted to said feed-out control means.

7. A semiconductor memory circuit claimed in claim 6 further including a reset signal input terminal and a reset signal output terminal directly connected to each other and also connected to said feed-out control means, so that when said feed-out control means receives a reset signal from said reset signal input terminal, said feed-out control means initializes said read-out control means.

8. A semiconductor memory circuit claimed in claim 7 wherein said feed-out means includes a fifth AND gate having its one input connected to receive the data read out from said semiconductor memory device, and its other input connected to receive said output of said first AND gate through a second delay circuit, an output of said fifth AND gate being connected to said one input of said first OR gate.

9. A semiconductor memory circuit claimed in claim 7 wherein said feed-out means includes a feed-out register receiving the data read out from said semiconductor memory device in parallel, and also receiving said output of said first AND gate through a second delay circuit as a feed-out clock, a serial output of said feed-out register being connected to said one input of said first OR gate, and said read-out controller receives an address control signal from a frequency divider which receives said output of said first AND gate, an output of said frequency divider being supplied through a third delay circuit as a fetch signal to said feed-out register.

10. A semiconductor memory circuit claimed in claim 7 wherein said semiconductor memory device is a mask ROM.

11. A semiconductor memory module comprising:
a substantially square package accommodating therein a semiconductor memory circuit which includes a semiconductor memory device, a read-out controller generating on the basis of a synchronous signal supplied from an external an address signal to said semiconductor memory device for the purpose of reading out data from said semiconductor memory device, said read-out controller also generating a read end signal when the reading of the data from said read-out controller has been completed, a feed-out means receiving the data read out from said semiconductor memory device for outputting the received data, a first gate means receiving the data outputted from said feed-out means and data from an external for outputting a selected one of the received two data, a feed-out control means receiving said read end signal for generating a feed-out control signal, a second gate means responding to said feed-out control signal to control said read-out control means so as to stop the generation of said address signal supplied to said semiconductor memory device, and a third gate means responding to said feed-out control signal to start to supply said synchronous signal to an external;
a set of terminals formed on each of four sides of said square package, the terminals on the four sides being so configured that the same kind of signal is transferred through positionally corresponding terminals of four sides of the square package, the terminals on one side being of a plug type and the terminals on the remaining three sides being of a socket type terminals of said three sides being interconnected so as to interconnect the terminals for the same signal.

12. An acoustic signal reproducing system including:
means for generating a synchronous signal;
means receiving data from an external for generating a digital code of a predetermined length;
means receiving said digital code for converting said received digital code into an analog signal;
a plurality of semiconductor memory modules connected to each other in a cascaded manner, each of said semiconductor memory modules comprising:
a substantially square package accommodating therein a semiconductor memory circuit which includes a semiconductor memory device, a read-out controller generating on the basis of a synchronous signal supplied from an external an address signal to said semiconductor memory device for the purpose of reading out data from said semiconductor memory device, said read-out controller also generating a read end signal when the reading of the data from said read-out controller has been completed, a feed-out means receiving the data read out from said semiconductor memory device for outputting the received data, a first gate means receiving the data outputted from said feed-out means and data from an external for outputting a selected one of the received two data, a feed-out control means receiving said read end signal for generating a feed-out control signal, a second gate means responding to said feed-out control signal to control said read-out control means so as to stop the generation of said address signal supplied to said semiconductor memory device, and a third gate means responding to said feed-out control signal to start to supply said synchronous signal to an external;

a set of terminals formed on each of four sides of said square package, the terminals on the four sides being so configured that the same kink of signal is transferred through positionally corresponding terminals of four sides of the square package, the terminals on one side being of a plug type and the terminals on the remaining three sides being of a socket type which can be fitted and connected with the plug type terminal so as to interconnect corresponding signal lines, positionally corresponding socket type terminals of said three sides being interconnected so as to interconnecting the terminals for the same signal, a first one of said cascaded semiconductor memory modules being connected to supply said data to said digital code generating means, a tail end one of said cascaded semiconductor memory modules being connected with a terminator.

* * * * *